United States Patent
Chen et al.

(10) Patent No.: US 12,035,588 B2
(45) Date of Patent: Jul. 9, 2024

(54) ARRAY SUBSTRATE AND METHOD FOR MANUFACTURING THE SAME, DISPLAY PANEL

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Gong Chen, Beijing (CN); Yuqing Yang, Beijing (CN); Yiyang Zhang, Beijing (CN); Zheng Bao, Beijing (CN); Zhiyong Yang, Beijing (CN); Yang Zhou, Beijing (CN); Huijun Li, Beijing (CN); Tingliang Liu, Beijing (CN); Huijuan Yang, Beijing (CN); Xin Zhang, Beijing (CN); Meng Zhang, Beijing (CN); Xiaofeng Jiang, Beijing (CN); Hao Zhang, Beijing (CN); Yu Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 487 days.

(21) Appl. No.: 17/437,033

(22) PCT Filed: Jan. 20, 2021

(86) PCT No.: PCT/CN2021/072826
§ 371 (c)(1),
(2) Date: Sep. 7, 2021

(87) PCT Pub. No.: WO2021/147887
PCT Pub. Date: Jul. 29, 2021

(65) Prior Publication Data
US 2022/0181426 A1    Jun. 9, 2022

(30) Foreign Application Priority Data

Jan. 22, 2020  (CN) .......................... 202010075245.6

(51) Int. Cl.
H10K 59/131  (2023.01)
(52) U.S. Cl.
CPC ................................ H10K 59/131 (2023.02)
(58) Field of Classification Search
CPC ...... H10K 50/00; H10K 50/16; H10K 50/166; H10K 50/81; H10K 50/813; H10K 50/88; H10K 59/00; H10K 59/131
See application file for complete search history.

(56) References Cited

U.S. PATENT DOCUMENTS

| 2014/0014913 | A1 | 1/2014 | Lee |
| 2017/0351365 | A1* | 12/2017 | Sasaki ................... G06F 3/0443 |
| 2018/0151850 | A1* | 5/2018 | Lee ......................... H10K 59/30 |

FOREIGN PATENT DOCUMENTS

| CN | 103092417 A | 5/2013 |
| CN | 104461202 A | 3/2015 |

(Continued)

OTHER PUBLICATIONS

Office Action dated Jan. 6, 2022 issued in corresponding Chinese Application No. 202010075245.6.

*Primary Examiner* — Brook Kebede
(74) *Attorney, Agent, or Firm* — Nath, Goldberg & Meyer; Joshua B. Goldberg (57) ABSTRACT

The present disclosure provides an array substrate, a method for manufacturing an array substrate and a display panel. The array substrate includes: a base having a display area, a peripheral area surrounding the display area, and a visible area located between the display area and the peripheral area; a plurality of voltage signal lines disposed on the base; a metal strip disposed on the base, the voltage signal lines (Continued)

are coupled to the metal strip, at least a portion of the metal strip is located in the visible area, and the portion of the metal strip located in the visible area is provided with an opening.

20 Claims, 4 Drawing Sheets

(56) References Cited

FOREIGN PATENT DOCUMENTS

| | | |
|---|---|---|
| CN | 106684100 A | 5/2017 |
| CN | 106873225 A | 6/2017 |
| CN | 107390444 A | 11/2017 |
| CN | 107579078 A | 1/2018 |
| CN | 207601767 U | 7/2018 |
| CN | 108447872 A | 8/2018 |
| CN | 207780739 U | 8/2018 |
| CN | 109375837 A | 2/2019 |
| CN | 110289289 A | 9/2019 |
| CN | 111192910 A | 5/2020 |
| JP | 2009-10258 A | 1/2009 |

* cited by examiner

ARRAY SUBSTRATE AND METHOD FOR MANUFACTURING THE SAME, DISPLAY PANEL

CROSS-REFERENCE TO RELATED APPLICATIONS

This is a National Phase Application filed under 35 U.S.C. 371 as a national stage of PCT/CN2021/072826, filed Jan. 20, 2021, an application claiming the benefit of Chinese Application No. 202010075245.6, filed Jan. 22, 2020, the content of each of which is hereby incorporated by reference in its entirety.

TECHNICAL FIELD

The present disclosure relates to the field of display technology, and in particular to an array substrate, a method for manufacturing an array substrate and a display panel.

BACKGROUND

In a flexible organic light emitting display panel, an external power supply directly transmits a voltage (ELVDD, ELVSS) for lighting organic light emitting diodes to a display screen through a flexible circuit board (FPC). A wiring design of voltage signal lines should ensure stability of the supplied voltage as much as possible, to reduce voltage loading difference, and ensure a relatively good long range uniformity (LRU) of a product.

SUMMARY

In an aspect of the present disclosure, an embodiment of the present disclosure provides an array substrate including: a base having a display area, a peripheral area surrounding the display area, and a visible area located between the display area and the peripheral area; a plurality of voltage signal lines on the base; a metal strip located on the base, the voltage signal lines are coupled to the metal strip, at least a portion of the metal strip is located in the visible area, and the portion of the metal strip located in the visible area is provided with an opening.

In some implementations, the voltage signal lines extend from the visible area into the display area.

In some implementations, the metal strip has at least the opening in one column in the visible area between the display area and the peripheral area.

In some implementations, the opening has at least one first metal connection line therein, the first metal connection line dividing the opening into a plurality of sub-openings.

In some implementations, the at least one first metal connection line includes a plurality of first metal connection lines, each of the plurality of first metal connection lines extends along a direction in which the voltage signal lines extend, and widths of the plurality of first metal connection lines in a direction perpendicular to the direction in which the first metal connection lines extend are substantially equal to each other.

In some implementations, the opening is divided by the plurality of first metal connection lines into the plurality of sub-openings having substantially a same width in the direction perpendicular to the direction in which each of the first metal connection lines extends.

In some implementations, the first metal connection line is arranged in line with connection ends of the voltage signal lines.

In some implementations, the opening further includes a second metal connection line coupled to the first metal connection line to further divide the sub-opening into a plurality of areas.

In some implementations, the second metal connection line extends in the direction perpendicular to the direction in which the first metal connection line extends.

In some implementations, a width of a portion of the metal strip other than the opening is substantially equal to a width of the first metal connection line in the direction perpendicular to the direction in which the first metal connection line extends.

In some implementations, an edge of the first metal connection line has an arc-shaped portion.

In some implementations, an edge of the second metal connection line has an arc-shaped portion.

In another aspect of the present disclosure, an embodiment of the present disclosure further provides a method for manufacturing the array substrate described above, the method including: forming a metal layer on a base, and patterning the metal layer by using a patterning process to form the voltage signal lines and the metal strip.

In another aspect of the present disclosure, an embodiment of the present disclosure further provides a display panel, where the display panel includes the array substrate described above and a cover plate covering the array substrate, and an ink layer is disposed on the cover plate, and an orthographic projection of the ink layer on the array substrate covers the peripheral area of the array substrate.

DESCRIPTION OF DRAWINGS

The above and/or other aspects and advantages of the present disclosure will become apparent and readily appreciated from the following description of the embodiments, taken in conjunction with the accompanying drawings in which.

DESCRIPTION OF EMBODIMENTS

Reference will now be made in detail to embodiments of the present disclosure, examples of which are illustrated in the accompanying drawings, where like or similar reference numerals refer to the same or similar elements or elements having the same or similar functions. The embodiments described below with reference to the accompanying drawings are illustrative only for the purpose of explaining the present disclosure and should not be construed as limiting of the present disclosure.

Generally, a wiring of voltage signal lines in an array substrate in a display panel is designed as follows: for example, the voltage signal lines on left and right sides of a display area are interconnected to form a large metal sheet above the display area, and then a plurality of branches are generated and extended into the display area to provide voltages for pixel driving circuits in the display area. Thus, the wiring design can ensure stability of the supplied voltage, reduce a voltage loading difference, and ensure a relatively good long range uniformity of a product.

However, at present, the display panel has a defect of light being reflected by metal, which affects display of the display panel and is partially caused by the large metal sheet formed by the wiring of the voltage signal lines. In particular, due to precision, when a cover glass is attached to the array substrate in the display panel, an edge of ink on the cover glass and an edge of the display area of the array substrate are usually not flush, that is, a non-display area exists between the edge of the ink and the edge of the display area, the non-display area may be referred to as a visible area, an area where the ink is located corresponds to a peripheral area surrounding the display area, i.e., the visible area is located between the display area and the peripheral area surrounding the display area, and since the voltage signal lines form the large metal sheet outside the display area, that is, the large metal sheet has a relatively large area, and under irradiation of external light, the large metal sheet would reflect ambient light in an area outside the display area and inside the visible area (i.e., the area between the edge of the ink and the edge of the display area), so that a metal light reflection area visible to human's eyes appears, that is, a bad phenomenon of light being reflected by metal appears, and the display of the display panel is influenced.

Figure 1:
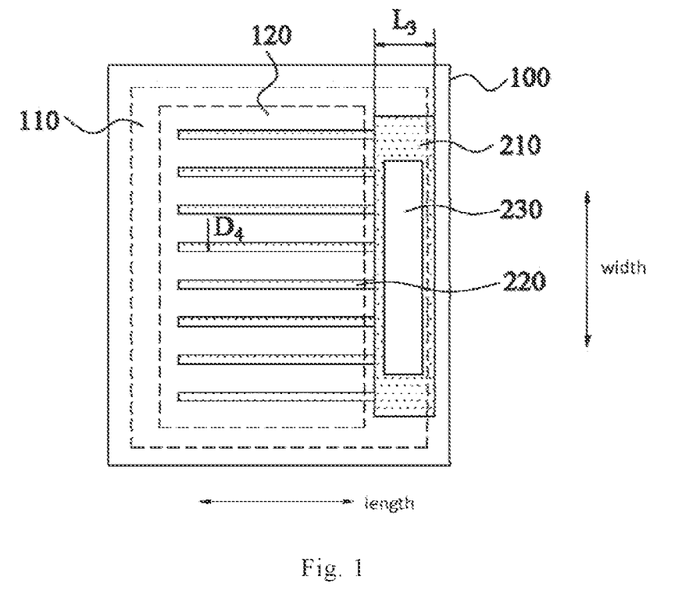
FIGS. 1 to 7 illustrate schematic structural diagrams of an array substrate according to embodiments of the present disclosure.

In an aspect of the present disclosure, an embodiment of the present disclosure provides an array substrate, referring to FIG. 1, the array substrate including: a base 100, a plurality of voltage signal lines 220 and a metal strip 210, where the base 100 has a display area 120, a peripheral area surrounding the display area 120, and a visible area 110 located between the display area 120 and the peripheral area, the plurality of voltage signal lines 220 and the metal strip 210 are both disposed on the base 100, the plurality of voltage signal lines 220 are coupled to the metal strip 210, at least a portion of the metal strip 210 is located in the visible area 110, and the portion of the metal strip 210 located in the visible area 110 has an opening 230.

By providing the opening 230 in the portion of the metal strip 210 located in the visible area 110, the reflective area of the metal strip 210 can be reduced, so as to alleviate a defect of light being reflected by metal, and improve the display quality of the display panel using the array substrate.

It should be understood that, in the embodiment of the present disclosure, for example, a length (e.g., L3 shown in FIG. 1) of the metal strip 210 in the extending direction of the voltage signal lines 220 may be greater than a width (e.g., D4 shown in FIG. 1) of each voltage signal line 220 in the extending direction of the metal strip 210.

According to an embodiment of the present disclosure, referring to FIG. 1, the voltage signal lines 220 may extend from the visible area 110 into the display area 120.

The following describes each structure of the array substrate according to an embodiment of the present disclosure in detail.

According to the embodiment of the present disclosure, the opening 230 of the metal strip 210 may be disposed as close to the display area 120 as possible. Therefore, the defect of light being reflected by metal can be further relieved.

It should be understood that although the provision of the opening 230 in the metal strip 210 can alleviate the defect of light being reflected by metal, the unreasonable design of the opening 230 may affect along range uniformity of the product, and therefore, the size and structure of the opening 230 can be designed while the opening 230 is provided in the metal strip 210, so as to ensure the long range uniformity of the product while effectively alleviating the defect of light being reflected by metal.

Figure 2:
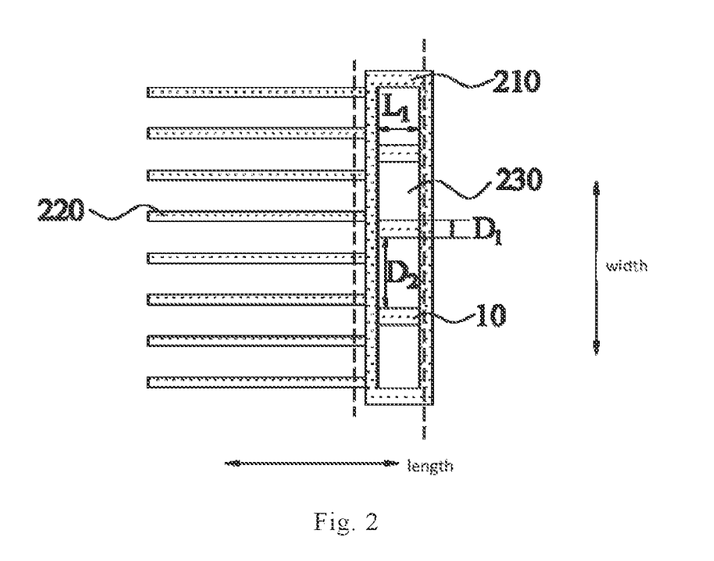

According to the embodiment of the present disclosure, referring to FIG. 2, at least one first metal connection line 10 may be disposed in the opening 230, and the first metal connection line 10 can divide the opening 230 into a plurality of sub-openings. For example, the first metal connection line 10 may extend along a direction (e.g., a length direction) in which the voltage signal lines 220 extend. By providing the first metal connection line 10 in the opening 230, a resistance of the metal strip 210 can be reduced, to guarantee stability of voltages input by the voltage signal lines, and thus not only the defect of light being reflected by metal can be alleviated, but also it is favorable to guarantee the long range uniformity of the product.

According to the embodiment of the present disclosure, referring to FIG. 2, the opening 230 may extend along a direction (e.g., a width direction) in which the metal strip 210 extends.

To significantly alleviate the defect of light being reflected by metal, the opening 230 may be as large as possible. However, the opening 230 being too large may not be beneficial to ensure the long range uniformity of the product.

It should be understood that the metal strip 210 may include at least the opening 230 in one column (only the opening in one column is shown in FIGS. 1 and 2) in the visible area 110 between the display area 120 and the peripheral area.

As an example, in a direction (e.g., a length direction) in which the voltage signal lines 220 extend, a length of the opening 230 (e.g., L1 shown in FIG. 2) may range from about 150 μm to about 300 μm, and for example, may be 150 μm, 180 μm, 200 μm, 220 μm, 250 μm, 280 μm, 300 μm, or the like. The length of the opening 230 is set within the above range in the embodiment of the present disclosure, which not only can significantly alleviate the defect of light being reflected by metal, but also is beneficial to ensure the long range uniformity of the product. When the length of the opening 230 is less than the width of the above range, it may be disadvantageous to significantly alleviate the defect of light being reflected by metal, and when the length of the opening 230 is greater than the width of the above range, it may be disadvantageous to ensure the long range uniformity of the product.

Figure 3:
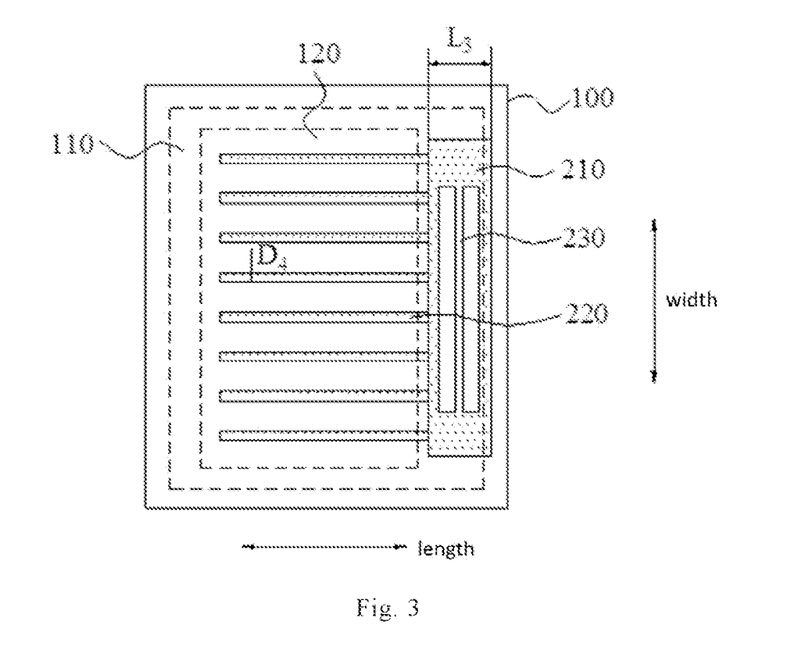

According to the embodiment of the present disclosure, for a product in which the length of the metal strip 210 (a dimension along the direction in which the voltage signal lines 220 extend, for example, as shown by $L_3$ in FIG. 1) is less than or equal to about 440 μm, the opening 230 in one column may be disposed in the metal strip 210 in the visible area 110 between the display area 120 and the peripheral area, and for a product in which the length of the metal strip 210 is greater than about 440 μm, a plurality of columns of openings 230 may be disposed in the metal strip 210 in the visible area 110 between the display area 120 and the peripheral area, for example, FIG. 3 shows two columns of openings 230.

It should be understood that, regarding the specific number of columns of openings in the metal strip 210, the design may be made according to actual requirements for the product, and in a case where multiple columns of openings 230 are arranged in the metal strip 210, the multiple columns of openings 230 may have structures the same as each other or different from each other, and the embodiment of the present disclosure is shown and described for the specific structure of the opening 230 in one column 230, and a person skilled in the art may select an appropriate structure for each opening in the columns as required.

According to the embodiment of the present disclosure, referring to FIG. 2, if the first metal connection line 10 extends along the direction in which the voltage signal lines 220 extend, a width of the first metal connection line 10 (e.g., a dimension in a direction perpendicular to the extending direction thereof, such as $D_1$ shown in FIG. 2) may range from about 1 μm to about 200 μm, and for example, may be 1 μm, 10 μm, 20 μm, 50 μm, 80 μm, 100 μm, 120 μm, 150 μm, 180 μm, or 200 μm, etc., and a plurality of first metal connection lines 10 having a same width may be disposed within the opening 230. When the width of the first metal connection line 10 is greater than about 200 μm, it is not beneficial to significantly alleviate the defect of light being reflected by metal, and when the width of the first metal connection line 10 is less than about 1 μm, it is not beneficial to ensure the long range uniformity of the product. The width of first metal connection line 10 in the embodiment of the present disclosure is set within the range mentioned above, not only the defect of light being reflected by metal can be effectively alleviated, but also is favorable to guarantee the long range uniformity of the product.

According to the embodiment of the present disclosure, referring to FIG. 2, in the direction (e.g., the width direction) in which the metal strip 210 extends, the opening 230 is divided by a plurality of first metal connection lines 10 into a plurality of sub-openings having a same width, as shown in FIG. 2, the first metal connection lines 10 may extend along the direction in which the voltage signal lines 220 extend, and a width of each sub-opening may be $D_2$, in such case, for example, about 1 μm≤$D_2$≤about 500$D_1$, where $D_1$ is the width of the first metal connection line 10. When the width of each sub-opening is less than about 1 μm, the arrangement of the first metal connection lines 10 is too dense, which is not favorable for significantly alleviating the defect of light being reflected by metal, and when the width of each sub-opening is greater than about 500$D_1$, the arrangement of the first metal connection lines 10 is too sparse, which is not favorable for ensuring the long range uniformity of the product. The embodiment of the present disclosure enables the width of each sub-opening within the range mentioned above, not only the defect of light being reflected by metal can be effectively alleviated, but also it is favorable to guarantee the long range uniformity of the product.

According to the embodiment of the present disclosure, one first metal connection line 10 may be disposed within the opening 230, for example, for a product in which the width of the metal strip 210 (the dimension along the extending direction of the metal strip, such as the dimension in the same direction as $D_1$ and $D_2$ shown in FIG. 2) is about 120 mm, one first metal connection line 10 may be disposed within the opening 230, and the width of the first metal connection line 10 (the dimension along the extending direction of the metal strip, such as $D_1$ shown in FIG. 2) may range from about 100 μm to about 200 μm. The long range uniformity obtained by the structure mentioned above differs a little from the long range uniformity obtained in a case where no opening 230 is provided in metal strip 210 at present, and thus, with the structure mentioned above, not only the defect of light being reflected by metal can be effectively alleviated, but also it can make the product have a relatively good long range uniformity.

According to the embodiment of the present disclosure, referring to FIG. 2, a plurality of first metal connection lines 10 may also be disposed in the opening 230, widths (e.g., $D_1$) of the plurality of first metal connection lines 10 may be equal to each other, the opening 230 may be divided by the plurality of first metal connection lines 10 into a plurality of sub-openings having, for example, a same width, and the width of each sub-opening (e.g., $D_2$) may satisfy, for example, that $D_2$ is greater than or equal to about 1 μm and less than or equal to about 500$D_1$, where $D_1$ is the width of the first metal connection line 10. Therefore, the structure mentioned above can not only effectively alleviated the defect of light being reflected by metal, but also can make the product have a relatively good long range uniformity.

According to the embodiment of the present disclosure, when the width (e.g., $D_1$) of the first metal connection line 10 and the width (e.g., $D_2$) of each sub-opening respectively satisfy ranges mentioned above, the specific width of the first metal connection line 10 and the specific width of each sub-opening are not particularly limited, as long as the width of the first metal connection line 10 and the width of each sub-opening are matched, so as to achieve purposes of alleviating the defect of light being reflected by metal and enabling the product to have a relatively good long range uniformity. For example, according to a specific embodiment of the present disclosure, a plurality of first metal connection lines 10 may be disposed within the opening 230, each of the first metal connection lines 10 may have a width of about 20 μm, and the opening 230 may be divided by the first metal connection lines 10 into a plurality of sub-openings each having a width of about 2000 μm. The long range uniformity obtained by the structure mentioned above differs a little from the long range uniformity obtained in a case where no opening 230 is provided in the metal strip 210 at present, and thus, with the structure mentioned above, not only the defect of light being reflected by metal can be effectively alleviated, but also it can make the product have a relatively good long range uniformity. The range mentioned above of the width of the first metal connection line 10 and the range mentioned above of the width of each sub-opening are suitable for products in which the width of the metal strip 210 has different values.

Figure 4:
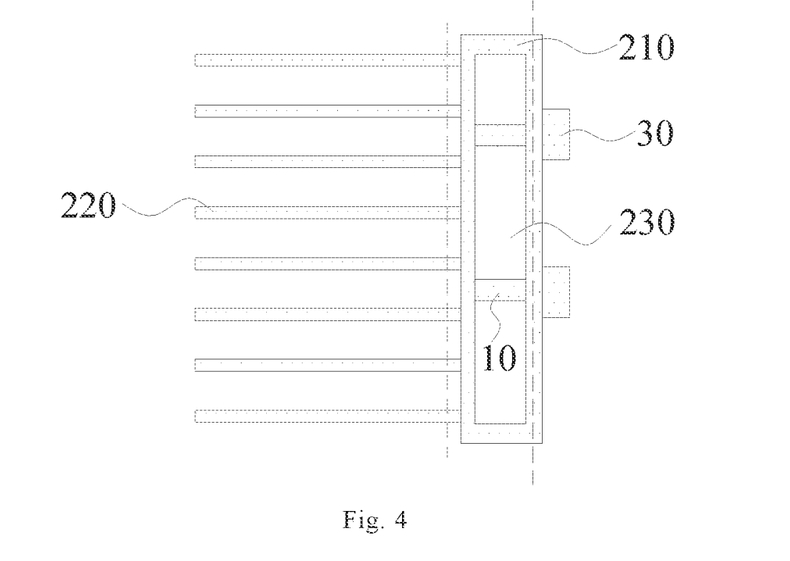

According to the embodiment of the present disclosure, referring to FIG. 4, when the width of the first metal connection line 10 ranges from about 1 μm to 200 μm, the first metal connection line 10 may be disposed in line with a connection end (i.e., VDD bridge) 30 of the voltage signal line 220. For example, in a product in which the width of the metal strip 210 is about 120 mm, the first metal connection line 10 may be disposed in line with the connection end 30 of the voltage signal line 220. The structure mentioned above not only can effectively relieve the defect of light being reflected by metal, but also can enable the product to have a relatively good long range uniformity. It should be noted that "the first metal connection line 10 being arranged in line with the connection end 30 of the voltage signal line 220" may refer to that the first metal connection line 10 is arranged at a corresponding position of the connection end 30 of the voltage signal line 220, or that a center line of the first metal connection line 10 is aligned with a center line of the connection end 30 of the voltage signal line 220.

Figure 5:
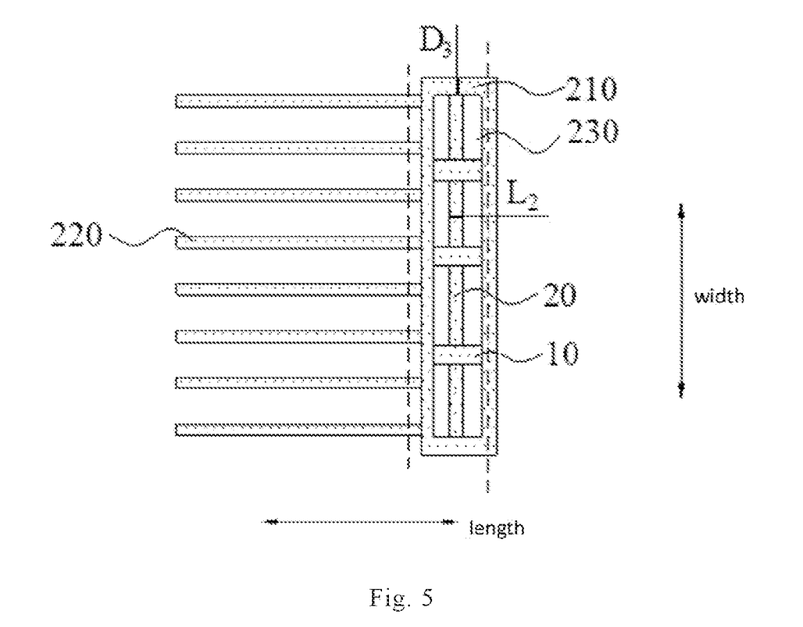

According to the embodiment of the present disclosure, referring to FIG. 5, the opening 230 may further include a second metal connection line 20 therein, the second metal connection line 20 may extend along the direction (e.g., the width direction) in which the metal strip 210 extends, and the second metal connection line 20 is coupled to the first metal connection line 10 to further divide the sub-opening into a plurality of areas. Therefore, a resistance of the metal strip 210 can be further reduced, to ensure stability of voltages input by the voltage signal lines, promote the long range uniformity of the product, and effectively alleviate the defect of light being reflected by metal simultaneously.

According to the embodiment of the present disclosure, referring to FIG. 5, the second metal connection line 20 may be disposed between two adjacent first metal connection lines 10, or each sub-opening of the opening 230 may be provided with the second metal connection line 20 therein, that is, the second metal connection line 20 may be disposed not only between two adjacent first metal connection lines 10, but also between an edge of the opening 230 and the first metal connection line 10. The structure mentioned above can effectively relieve the defect of light being reflected by metal, and is favorable for ensuring the long range uniformity of the product.

According to the embodiment of the present disclosure, referring to FIG. 5, in the direction (e.g., the length direction) in which the voltage signal lines 220 extend, a length of the second metal connection line 20 (e.g., L2 shown in FIG. 4) may range from about 5 μm to 20 μm, and for example, may be 5 μm, 8 μm, 10 μm, 12 μm, 15 μm, 18 μm, or 20 μm, and the like. Therefore, the defect of light being reflected by metal can be effectively relieved, and meanwhile, the long range uniformity of the product is guaranteed.

According to the embodiment of the present disclosure, referring to FIG. 5, in the direction (e.g., the width direction) in which the metal strip 210 extends, a width ($D_3$ shown in FIG. 5) of a portion of the metal strip 210 other than the opening 230 may be less than about 200 μm. For example, the width of the portion of the metal strip 210 other than the opening 230 ($D_3$ as shown in FIG. 5) may be substantially equal to the width of the first metal connection line 10 ($D_1$ as shown in FIG. 2). Therefore, a frame of the metal strip 210 has a relatively small width, which can further alleviate the defect of light being reflected by metal.

Figure 6:
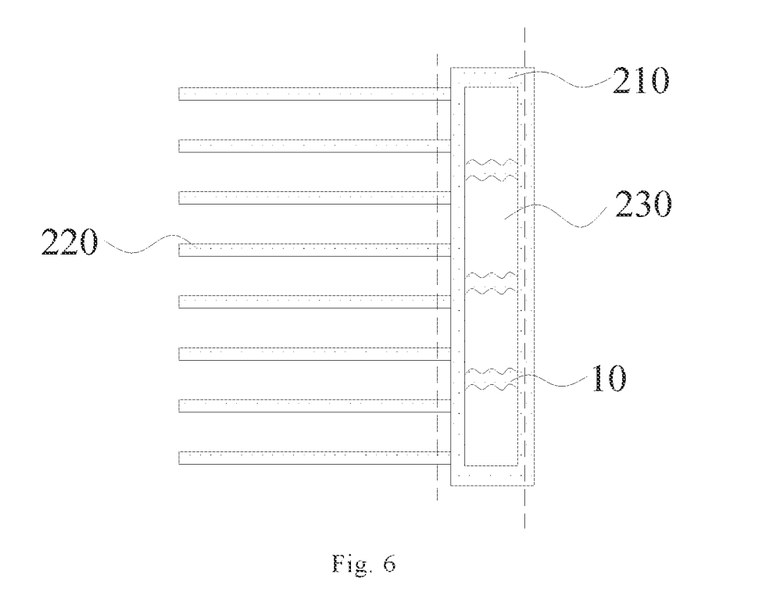

According to the embodiment of the present disclosure, an edge of the first metal connection line 10 may be of a straight line (refer to FIGS. 2, 4 and 5), and in order to further alleviate the defect of light being reflected by metal, referring to FIG. 6, the edge of the first metal connection line 10 may also have an arc-shaped portion. In particular, the first metal connection line 10 may have a wavy edge. By processing the edge of the first metal connection line 10 to be an arc edge, a shadow eliminating effect can be achieved, the effect that the human's eyes cannot observe the boundary of the first metal connection line 10 is achieved, and the defect of light being reflected by metal is further relieved.

Figure 7:
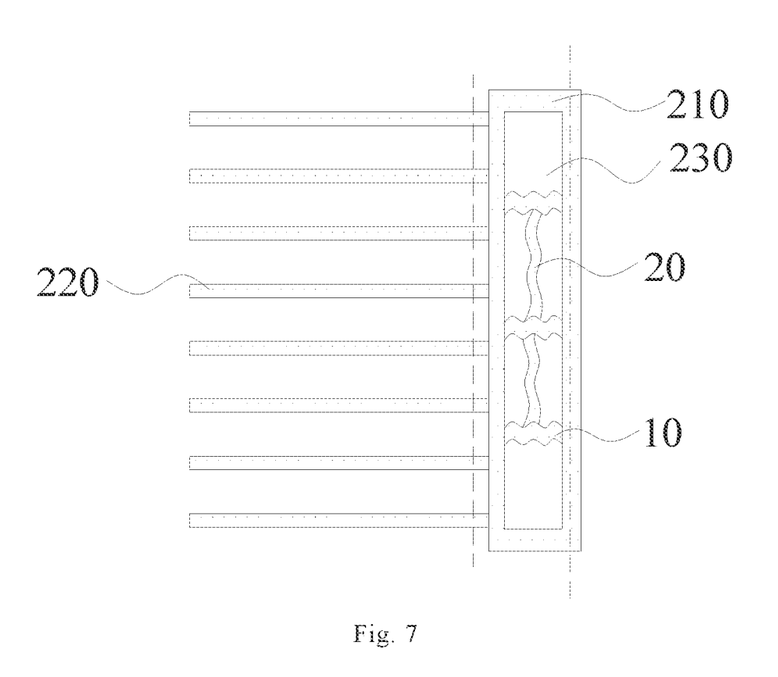

According to an embodiment of the present disclosure, the edge of the second metal connection line 20 may be of a straight line (refer to FIG. 5), and in order to further alleviate the defect of light being reflected by metal, referring to FIG. 7, the edge of the second metal connection line 20 may also have an arc-shaped portion. Specifically, the second metal connection line 20 may have a wavy edge. The edge of the second metal connection line 20 is processed into the arc edge, so that the shadow eliminating effect can be achieved, the effect that the human's eyes cannot observe a boundary of the second metal connection line 20 is achieved, and the defect of light being reflected by metal is further relieved.

According to the embodiment of the present disclosure, features that the first metal connection line 10 is disposed in the opening 230, the second metal connection line 20 is disposed in the opening 230, the edge of the first metal connection line 10 has an arc-shaped portion, and the edge of the second metal connection line 20 has an arc-shaped portion may be combined with each other at will, and various combinations of the above features fall within the scope of the present disclosure. For example, only the first metal connection line 10 may be disposed in the opening 230, and the edge of the first metal connection line is of a straight line, or only the first metal connection line 10 may be disposed in the opening 230, and the edge of the first metal connection line 10 has an arc-shaped portion, or the first metal connection line 10 and the second metal connection line 20 may be disposed in the opening 230, and edges of the first metal connection line 10 and the second metal connection line 10 are both of straight lines, or the first metal connection line 10 and the second metal connection line 20 may be disposed in the opening 230, and the edge of the first metal connection line 10 has an arc-shaped portion, or the first metal connection line 10 and the second metal connection line 20 may be disposed in the opening 230, and the edge of the first metal connection line 10 and the edge of the second metal connection line 20 both have arc-shaped portions.

For example, the opening 230 may be provided with the first metal connection line 10 and the second metal connection line 20, and the edge of the first metal connection line 10 is of a straight line, and the edge of the second metal connection line 20 has an arc-shaped portion, or the opening 230 may be provided with the first metal connection line 10 and the second metal connection line 20, and a portion of the edge of the first metal connection line 10 is of a straight line, another portion of the edge of the first metal connection line 10 has an arc-shaped portion, a portion of the edge of the second metal connection line 20 is of a straight line, and another portion of the edge of the second metal connection line 20 has an arc-shaped portion, or only the second metal connection line 20 may be provided in the opening 230, and the edge of the second metal connection line 20 is of a straight line or has an arc-shaped portion, and so on, which will not be described herein again.

In another aspect of the present disclosure, an embodiment of the present disclosure provides a method of manufacturing the array substrate described above. According to the embodiment of the present disclosure, the method includes: disposing a metal layer on a base; and forming voltage signal lines and a metal strip by using a patterning process based on the metal layer. Therefore, the array substrate capable of effectively relieving the defect of light being reflected by metal can be obtained by a simple method.

According to the embodiment of the present disclosure, the patterning process may be an etching process to form the metal strip and the voltage signal lines having a preset structure by using a mask having a corresponding shape. The structure of the metal strip has been described in detail above and will not be described in detail here.

In another aspect of the present disclosure, an embodiment of the present disclosure provides a display panel. According to the embodiment of the present disclosure, the display panel includes the array substrate described above. Therefore, the display panel has the features and advantages of the array substrate described above, and will not be described herein again. In general, the display panel has a good display effect.

The following examples are provided to illustrate the present disclosure and should not be construed as limiting of the scope of the present disclosure. The examples do not specify particular techniques or conditions, and are implemented according to the techniques or conditions described in the literature of the art or according to specifications of the product.

Example 1

The array substrate of the present example includes a base 100, and voltage signal lines 220 and a metal strip 210 disposed on the base 100, the voltage signal lines 220 are coupled to the metal strip 210, the metal strip 210 has an opening 230, the length of the metal strip 210 is about 440 μm (referring to the dimension in the length direction in FIG. 2), the width of the metal strip 210 is about 120 mm (referring to the dimension in the width direction in FIG. 2), the length $L_1$ of the opening 230 is about 200 μm, a plurality of first metal connection lines 10 are disposed in the opening 230, the width $D_1$ of the first metal connection line 10 is about 20 μm, the opening 230 is divided by the first metal connection lines 10 into a plurality of sub-openings having a same width, and the width of each sub-opening is about 10000 μm.

After the array substrate is assembled into a display panel, no metallic luster line is observed under strong light irradiation, and the long range uniformity of the display panel has a value of 91.78%.

Example 2

The array substrate of the present example is substantially the same as the array substrate of example 1, except that the length $L_1$ of the opening 230 is about 300 μm.

After the array substrate is assembled into a display panel, no metallic luster line is observed under strong light irradiation, and the long range uniformity of the display panel has a value of 91.42%.

Example 3

The array substrate of the present example is substantially the same as the array substrate of example 1 except that the width of each of the sub-openings obtained by dividing the opening 230 by the plurality of first metal interconnection lines 10 is about 2000 μm.

After the array substrate is assembled into a display panel, no metallic luster line is observed under strong light irradiation, and the long range uniformity of the display panel has a value of 92.52%.

Example 4

The array substrate of the present example is substantially the same as the array substrate of example 1 except that the length $L_1$ of the opening 230 is about 300 μm and the width of each of the sub-openings obtained by dividing the opening 230 by the plurality of first metal interconnection lines 10 is about 2000 μm.

After the array substrate is assembled into a display panel, no metallic luster line is observed under strong light irradiation, and the long range uniformity of the display panel has a value of 92.01%.

Example 5

The array substrate of the present example is substantially the same as the array substrate of example 1, except that the first metal connection line 10 is provided only at a position corresponding to the connection end of the voltage signal line 220, that is, the first metal connection line 10 is provided in line with the connection end of the voltage signal line.

After the array substrate is assembled into a display panel, no metallic luster line is observed under strong light irradiation, and the long range uniformity of the display panel has a value of 92.03%.

Comparative Example 1

The array substrate of the present comparative example includes a base, and voltage signal lines and a metal strip provided on the base, the voltage signal lines are coupled to the metal strip, and the metal strip is not provided with an opening.

After the array substrate is assembled into a display panel, under strong light irradiation, obvious metal luster lines are observed, and the long range uniformity value of the display panel is about 93.24%.

It should be noted that the long range uniformity is an index for determining optical characteristics of the display panel by testing brightness and contrast brightness differences of block areas of the display panel, and the larger the value of the long range uniformity is, the better the long range uniformity of the display panel is.

As can be seen from comparison between examples 1 to 5 and the comparative example 1, no metallic luster line is observed in any of the display panels obtained in the examples 1 to 5, which significantly improves the defect of light being reflected by metal at present, and values of the long range uniformity of the display panels obtained in the examples 1 to 5 are not much different from that of the display panel obtained in the comparative example 1, i.e., the display panels obtained in the examples 1 to 5 each have a relatively good long range uniformity.

In the description of the present disclosure, the orientation or positional relationship indicated by the term "on", "under" or the like may be understood as being based on the orientation or positional relationship shown in the drawings, is merely for convenience of describing the present disclosure, and does not require that the present disclosure must be constructed and operated in a particular orientation, and therefore, should not be construed as limiting of the present disclosure.

References throughout this specification to the description of "an embodiment," "another embodiment," or the like, means that a particular feature, structure, material, or characteristic described in conjunction with the embodiment is included in at least one embodiment of the present disclosure. In this specification, the schematic representations of the terms used above are not necessarily intended to refer to a same embodiment or example. Furthermore, the particular features, structures, materials, or characteristics described may be combined in any suitable manner in any one or more embodiments or examples. Moreover, various embodiments or examples and features of various embodiments or examples described in this specification may be combined by one skilled in the art without conflict. In addition, it should be noted that the terms "first" and "second" in this specification are used for descriptive purposes only and are not to be construed as indicating or implying relative importance or to imply that the number of indicated technical features.

While embodiments of the present disclosure have been shown and described above, it is understood that the above embodiments are exemplary and should not be construed as limiting of the present disclosure, and that changes, modifications, feature replacements, variations, etc. may be made by those of ordinary skill in the art within the scope of the present disclosure.

The invention claimed is:
1. An array substrate, comprising:
a base having a display area, a peripheral area surrounding the display area, and a visible area located between the display area and the peripheral area;
a plurality of voltage signal lines on the base; and
a metal strip on the base, the plurality of voltage signal lines being coupled to the metal strip, wherein, at least a portion of the metal strip is located within the visible area, and the portion of the metal strip located within the visible area has an opening.

2. The array substrate of claim 1, wherein the voltage signal lines extend from the visible area into the display area.

3. The array substrate of claim 1, wherein the metal strip has at least the opening in one column in the visible area between the display area and the peripheral area.

4. The array substrate of claim 1, wherein the opening has at least one first metal connection line therein, the first metal connection line dividing the opening into a plurality of sub-opening s.

5. The array substrate of claim 4, wherein the at least one first metal connection line comprises a plurality of first metal connection lines, each of the plurality of first metal connection lines extends along a direction in which the voltage signal lines extend, and widths of the plurality of first metal connection lines in a direction perpendicular to a direction in which the first metal connection lines extend are substantially equal to each other.

6. The array substrate of claim 5, wherein the opening is divided by the plurality of first metal connection lines into a plurality of sub-openings having substantially a same width in the direction perpendicular to the direction in which each of the first metal connection lines extends.

7. The array substrate of claim 5, wherein the first metal connection line is arranged in line with connection ends of the voltage signal lines.

8. The array substrate of claim 5, wherein a width of the metal strip excluding the opening is substantially equal to a width of the first metal connection line in the direction perpendicular to the direction in which the first metal connection line extends.

9. The array substrate of claim 4, wherein the opening further comprises a second metal connection line therein, the second metal connection line is coupled to the first metal connection line, and the sub-opening is further divided into a plurality of areas.

10. The array substrate of claim 9, wherein the second metal connection line extends in a direction perpendicular to a direction in which the first metal connection line extends.

11. The array substrate of claim 9, wherein an edge of the second metal connection line has an arc-shaped portion.

12. The array substrate of claim 4, wherein an edge of the first metal connection line has an arc-shaped portion.

13. A display panel, comprising the array substrate of claim 1, and a cover plate covering the array substrate, wherein the cover plate is provided with an ink layer, and an orthographic projection of the ink layer on the array substrate covers the peripheral area of the array substrate.

14. The display panel of claim 13, wherein the voltage signal lines extend from the visible area into the display area.

15. The display panel of claim 13, wherein the metal strip has at least the opening in one column in the visible area between the display area and the peripheral area.

16. The display panel of claim 13, wherein the opening has at least one first metal connection line therein, the first metal connection line dividing the opening into a plurality of sub-openings.

17. The display panel of claim 16, wherein an edge of the first metal connection line has an arc-shaped portion.

18. The display panel of claim 16, wherein the opening further comprises a second metal connection line therein, the second metal connection line is coupled to the first metal connection line, and the sub-opening is further divided into a plurality of areas.

19. The display panel of claim 18, wherein the second metal connection line extends in a direction perpendicular to a direction in which the first metal connection line extends.

20. A method of manufacturing the array substrate of claim 1, comprising:
    forming a metal layer on a base, and patterning the metal layer by using a patterning process to form the voltage signal lines and the metal strip.

* * * * *